US012604642B2

(12) United States Patent
Xia

(10) Patent No.: US 12,604,642 B2
(45) Date of Patent: Apr. 14, 2026

(54) OLED DISPLAY PANEL, METHOD OF MANUFACTURING SAME, AND MICRO LENS

(71) Applicant: WUHAN CHINA STAR OPTOELECTRONICS SEMICONDUCTOR DISPLAY TECHNOLOGY CO., LTD., Wuhan (CN)

(72) Inventor: Cunjun Xia, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1346 days.

(21) Appl. No.: 16/966,028

(22) PCT Filed: Apr. 29, 2020

(86) PCT No.: PCT/CN2020/087734
§ 371 (c)(1),
(2) Date: Jul. 30, 2020

(87) PCT Pub. No.: WO2021/155644
PCT Pub. Date: Aug. 12, 2021

(65) Prior Publication Data
US 2023/0180585 A1 Jun. 8, 2023

(30) Foreign Application Priority Data

Feb. 7, 2020 (CN) .......................... 202010082614.4

(51) Int. Cl.
H10K 59/80 (2023.01)
H10K 59/12 (2023.01)
H10K 59/122 (2023.01)

(52) U.S. Cl.
CPC ....... *H10K 59/879* (2023.02); *H10K 59/1201* (2023.02); *H10K 59/122* (2023.02)

(58) Field of Classification Search
CPC ... H10K 59/122; H10K 59/879; H10K 50/858
See application file for complete search history.

(56) References Cited

U.S. PATENT DOCUMENTS 8,742,406 B1 6/2014 Leung
9,620,741 B2 * 4/2017 Hsu ..................... H10K 50/858
(Continued)

FOREIGN PATENT DOCUMENTS

CN 102479799 A 5/2012
CN 103033941 A 4/2013
(Continued)

*Primary Examiner* — Mary A Wilczewski
(74) *Attorney, Agent, or Firm* — PV IP PC; Peter Stecher; Wei Te Chung

(57) ABSTRACT

An OLED display panel, a method of manufacturing the same, and a micro lens are provided. Each of pixel opening areas is provided with a first micro lens, a first planarization layer, a second micro lens, and a second planarization layer from inside to outside. The first micro lens closes the pixel opening area, the second micro lens is aligned with the first micro lens and covers the first micro lens and the pixel opening area. A refractive index of the first micro lens is less than a refractive index of the first planarization layer, and a refractive index of the second micro lens is greater than a refractive index of the second planarization layer.

9 Claims, 4 Drawing Sheets

(56)          References Cited

U.S. PATENT DOCUMENTS

| | | | | |
|---|---|---|---|---|
| 11,106,882 B2 * | 8/2021 | Jung | .................... | H10K 39/32 |
| 2004/0213963 A1 * | 10/2004 | Bourdelais | ............ | H05K 3/107 |
| | | | | 428/188 |
| 2014/0027725 A1 * | 1/2014 | Lim | .................... | H10K 50/865 |
| | | | | 257/40 |
| 2014/0339509 A1 * | 11/2014 | Choi | ................... | H10K 50/858 |
| | | | | 257/40 |
| 2014/0361264 A1 | 12/2014 | Choi | | |
| 2016/0087018 A1 * | 3/2016 | Shim | ................... | H10K 50/865 |
| | | | | 257/40 |
| 2016/0268557 A1 * | 9/2016 | Sohn | .................... | H01M 50/55 |
| 2016/0301034 A1 * | 10/2016 | Hsu | .................... | H10K 50/858 |
| 2018/0012940 A1 * | 1/2018 | Park | .................... | H10K 59/122 |
| 2019/0251318 A1 * | 8/2019 | Jung | ................. | H10K 50/8445 |

FOREIGN PATENT DOCUMENTS

| | | | | | |
|---|---|---|---|---|---|
| CN | 106299150 | * | 1/2017 | .......... | H10K 50/858 |
| CN | 106898629 A | | 6/2017 | | |
| CN | 107579095 A | | 1/2018 | | |
| CN | 107731992 A | | 2/2018 | | |
| CN | 109192766 A | | 1/2019 | | |
| CN | 110610963 A | | 12/2019 | | |
| CN | 209785979 U | | 12/2019 | | |
| CN | 113299703 | * | 8/2021 | .......... | H10K 59/122 |
| JP | 2004227940 A | | 8/2004 | | |
| JP | 2012216454 A | | 11/2012 | | |

* cited by examiner

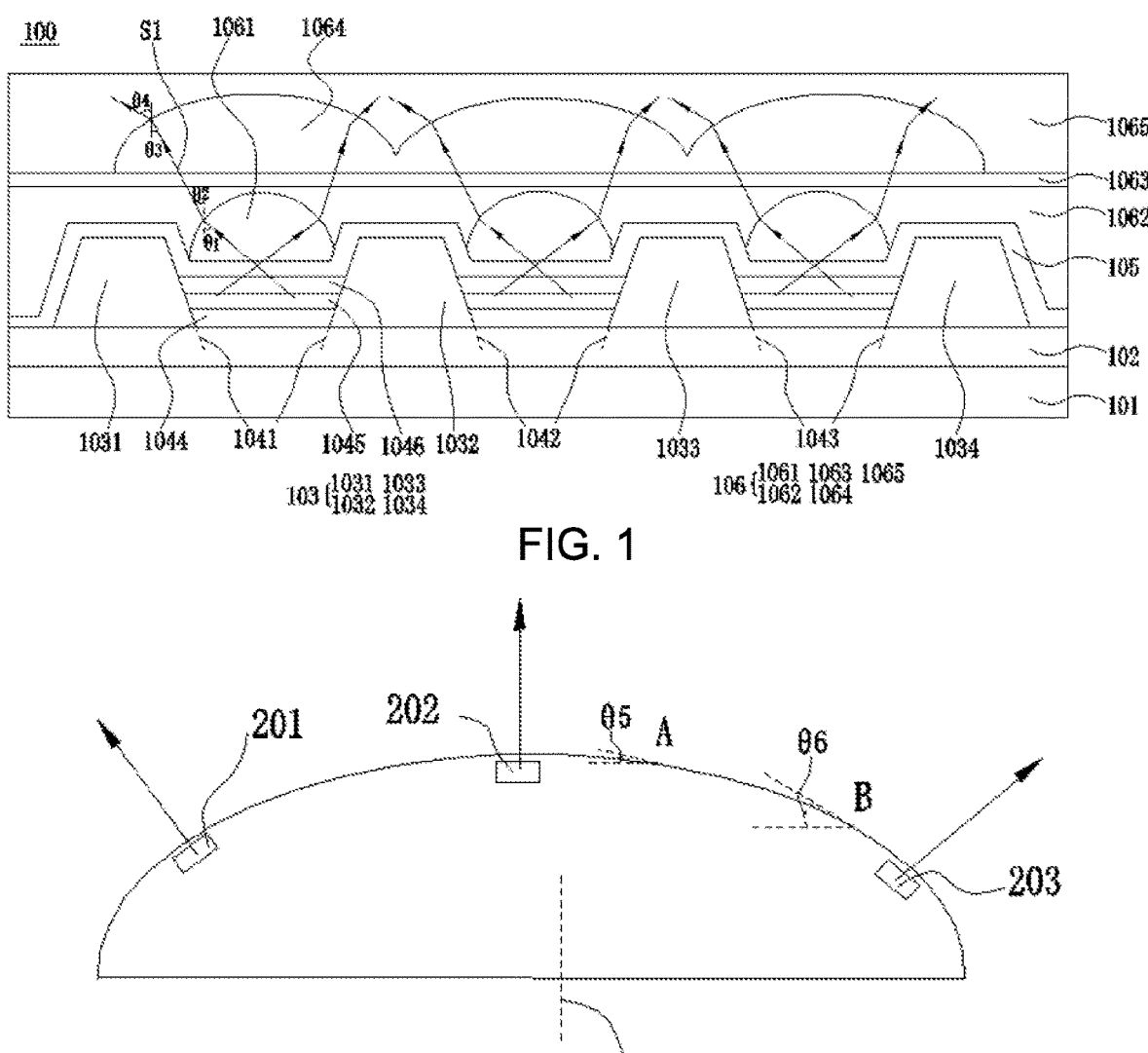

| | |
|---|---|
| Providing a substrate and sequentially forming a TFT layer and a pixel definition layer on the substrate, wherein the pixel definition layer is disposed separately to form a plurality of pixel opening areas | Step S10 |
| Sequentially laminating the pixel opening area from inside to outside to form an anode, a light emitting unit, a cathode, a first encapsulation layer, and a micro lens, wherein the first encapsulation layer is formed by stacking an inorganic layer, an organic layer, and an inorganic layer | Step S20 |

OLED DISPLAY PANEL, METHOD OF MANUFACTURING SAME, AND MICRO LENS

FIELD OF INVENTION

The present invention relates to the field of display technologies, and more particularly to an organic light emitting diode (OLED) display panel, a method of manufacturing the same, and a micro lens.

BACKGROUND OF INVENTION

Compared with liquid crystal displays, organic light emitting diode display panels have high contrast, wide color gamut, viewing angles, moving image response speed, etc., and thus are increasingly used in smart phones. With expansion of the application field of OLED display panels on smart phones, higher requirements have been put on display performance, such as a larger viewing angle and lower power consumption.

Because light emitted from a bottom of a pixel groove in the OLED display panel is output through an encapsulation layer and cover layer, etc., the output light has a specific directionality. Most light is emitted vertically from a screen, resulting in a small viewing angle of the OLED display panel. In addition, there is a certain reflectivity between a cathode and an anode in the pixel groove to form a microcavity. The light emitted by an OLED will interfere, reducing light efficiency displayed by the OLED and a light deviation angle. These factors directly affect the display performance and display viewing angles of the OLED display panel.

In summary, with the development of display technology, people's pursuit of larger screens, wider display viewing angles, and better visual experience has become a main trend of future development. In the prior art, most of the light in the OLED display panel is emitted vertically from the screen, which results in a small viewing angle and needs to be improved.

SUMMARY OF INVENTION

The present application provides an organic light emitting diode (OLED) display panel, a method of manufacturing the same, and a micro lens, which can solve technical problems that an OLED panel in the prior art has a small display viewing angle.

To solve the above issues, technical solutions provided by the present application are as follows:

An embodiment of the present application provides an organic light emitting diode (OLED) display panel comprising a substrate; a thin film transistor (TFT) layer disposed on a side of the substrate; and a pixel definition layer disposed on a side of the TFT layer away from the substrate. The pixel definition layer is separately arranged to form a plurality of pixel opening areas, and each of the pixel opening areas is sequentially arranged with an anode, a light emitting unit, a cathode, a first encapsulation layer, and a micro lens from inside to outside.

In an embodiment of the present application, the micro lens comprises a first micro lens and a second micro lens. The first micro lens is positioned in the pixel opening area, protrudes and closes the pixel opening area, the second micro lens is aligned with the first micro lens and covers the first micro lens and the pixel opening area.

In an embodiment of the present application, a bottom and two sides of the first micro lens are attached to a surface of the encapsulation layer.

In an embodiment of the present application, the OLED display panel further comprises a first planarization layer disposed between the first micro lens and the second micro lens; a second planarization disposed on a surface of the second micro lens, wherein a refractive index of the first micro lens is less than a refractive index of the first planarization layer, a refractive index of the second micro lens is greater than a refractive index of the second planarization layer; and a second encapsulation layer disposed on a side of the planarization layer away from the light emitting unit, wherein the second encapsulation layer comprises an inorganic layer.

In an embodiment of the present application, material of the first planarization layer and material of the second planarization layer comprise at least one material of acrylic-based resin, epoxy resin, phenolic resin, polyamide-based resin, polyimide-based resin, and unsaturated polyester resin; material of the first micro lens comprises polytetrafluoroethylene; material of the second micro lens comprises polystyrene.

In an embodiment of the present application, the refractive index of the first micro lens ranges from 1.1 to 1.35, the refractive index of the first planarization layer and the refractive index of the second planarization layer range from 1.4 to 1.5, and the refractive index of the second micro lens ranges from 1.5 to 2.0.

In an embodiment of the present application, the first micro lens and the second micro lens are arc-shaped structures, and each have a side facing the substrate being a plane.

In an embodiment of the present application, a horizontal angle of the arc-shaped structure near a center line is less than a horizontal angle of the circular arc structure away from the center line.

In an embodiment of the present application, the pixel opening area is one of an inverted trapezoid, an inverted triangle, and a fan shape.

In an embodiment of the present application, the anode, the light emitting unit, and the cathode are straight segments, the anode is positioned on a surface of the TFT layer, the light emitting unit is attached to a surface of the anode, the cathode is attached to a surface of the light emitting unit, and two ends of the anode, two ends of the light emitting unit, and two ends of the cathode are attached to a side wall of the pixel opening area.

In an embodiment of the present application, the first encapsulation layer is formed by stacking an inorganic layer, an organic layer, and an inorganic layer.

According to the above OLED display panel, an embodiment of the present application further provides a method of manufacturing an OLED display panel comprising a step S10, providing a substrate and sequentially forming a TFT layer and a pixel definition layer on the substrate, wherein the pixel definition layer is disposed separately to form a plurality of pixel opening areas; a step S20, sequentially laminating the pixel opening area from inside to outside to form an anode, a light emitting unit, a cathode, a first encapsulation layer, and a micro lens, wherein the first encapsulation layer is formed by stacking an inorganic layer, an organic layer, and an inorganic layer.

In an embodiment of the present application, the step S20 of sequentially laminating the pixel opening area from inside to outside to form the anode, the light emitting unit, the cathode, the first encapsulation layer, and the micro lens further comprises spraying ink droplets on a surface of the first encapsulation layer in the pixel opening area using an inkjet printing technology, curing the ink droplets to form a first micro lens, wherein the first micro lens protrudes and closes the pixel opening area; after the first micro lens is completed, coating a first planarization layer on a surface of the first micro lens and depositing a second encapsulation layer on the first planarization layer, wherein a refractive index of the first micro lens is less than a refractive index of the first planarization layer, and the second encapsulation layer comprises an inorganic layer; spraying ink droplets on a surface of the second encapsulation layer using the inkjet printing technology, curing the ink droplets to form a second micro lens, wherein the second micro lens is aligned with the first micro lens and covers the first micro lens and the pixel opening area; after the second micro lens is completed, coating a second planarization layer on a surface of the second micro lens, wherein a refractive index of the second micro lens is greater than a refractive index of the second planarization layer.

According an object of the present application, an embodiment of the present application further provides a micro lens comprising a first micro lens and a second micro lens. The first micro lens is aligned with the second micro lens, and the second micro lens covers the first micro lens.

In an embodiment of the present application, the micro lens further comprises a first planarization layer disposed between the first micro lens and the second micro lens; a second planarization disposed on a surface of the second micro lens, wherein a refractive index of the first micro lens is less than a refractive index of the first planarization layer, and a refractive index of the second micro lens is greater than a refractive index of the second planarization layer.

In an embodiment of the present application, the micro lens further comprises a second encapsulation layer disposed on a side of the planarization layer away from the light emitting unit, wherein the second encapsulation layer comprises an inorganic layer.

In an embodiment of the present application, material of the first planarization layer and material of the second planarization layer comprise at least one material of acrylic-based resin, epoxy resin, phenolic resin, polyamide-based resin, polyimide-based resin, and unsaturated polyester resin; material of the first micro lens comprises polytetrafluoroethylene; material of the second micro lens comprises polystyrene.

In an embodiment of the present application, the refractive index of the first micro lens ranges from 1.1 to 1.35, the refractive index of the first planarization layer and the refractive index of the second planarization layer range from 1.4 to 1.5, and the refractive index of the second micro lens ranges from 1.5 to 2.0.

In an embodiment of the present application, the first micro lens and the second micro lens are arc-shaped structures, and each have a side facing the substrate being a plane.

In an embodiment of the present application, a horizontal angle of the arc-shaped structure near a center line is less than a horizontal angle of the circular arc structure away from the center line.

Beneficial Effect

The embodiments of the present application provide an OLED display panel, a method of manufacturing the same, and a micro lens. Each pixel opening area is provided with a first micro lens and a second micro lens. The first micro lens is positioned in the pixel opening area, protrudes and closes the pixel opening area. The second micro lens is aligned with the first micro lens and covers the first micro lens and the pixel opening area. A first planarization layer is provided between the first micro lens and the second micro lens. A second planarization layer is provided on a surface of the second micro lens. A refractive index of the first micro lens is less than a refractive index of the first planarization layer. Therefore, the first micro lens narrows a viewing angle of the outgoing light, and more light hits the second micro lens. A refractive index of the second micro lens is greater than a refractive index of the second planarization layer, and an emission angle of the light emitted by the second micro lens becomes larger, thereby expanding an OLED display viewing angle. Therefore, the double-layer micro lens can improve a light extraction rate of the OLED display panel and improve a display viewing angle.

DESCRIPTION OF DRAWINGS

In order to more clearly explain the embodiments or the technical solutions in the prior art, the following will briefly introduce the drawings required in the embodiments or the description of the prior art. Obviously, the drawings in the following description are only some embodiments of the application, and those of ordinary skill in the art can obtain other drawings based on these drawings without creative efforts.

FIG. 1 is a schematic structural diagram of an OLED display panel provided by an embodiment of the present application.

FIG. 2 is a schematic structural diagram of a micro lens in an OLED display panel provided by an embodiment of the present application.

FIG. 3 is a schematic diagram of a preparation process of an OLED display panel provided by an embodiment of the present application.

DETAILED DESCRIPTION OF PREFERRED EMBODIMENTS

Figure 4:
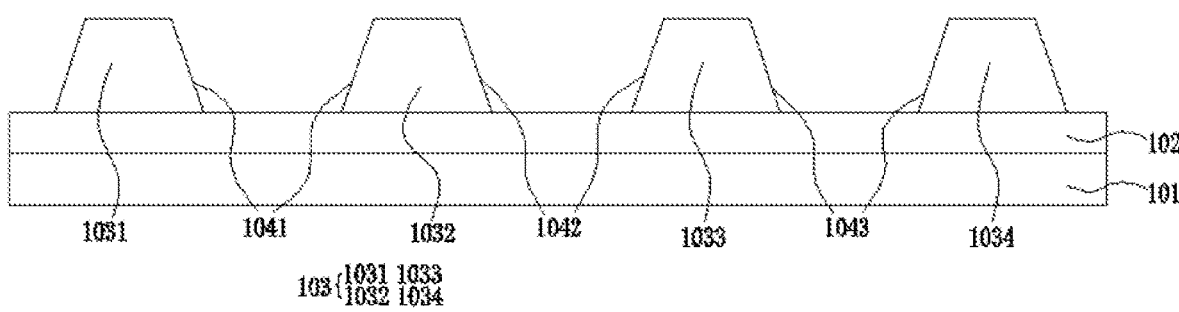
FIG. 4 is a schematic structural diagram of a substrate, a TFT layer, and a pixel definition layer in an OLED display panel provided by an embodiment of the present application.

The descriptions of the following embodiments refer to additional drawings to illustrate specific embodiments that can be implemented in the present application. Directional terms mentioned in this application, such as "upper", "lower", "front", "back", "left", "right", "inner", "outer", "side", etc., just refer to the directions of the attached drawings. Therefore, the directional term used is to illustrate and understand the present application, not to limit the present application. In the figures, units with similar structures are indicated by the same reference numerals. A dotted line in the figure indicates that it does not exist in a structure, and only illustrates a shape and a position of the structure.

The present application addresses technical problems that an OLED panel in the prior art has a small display viewing angle, and an embodiment can solve the defect.

As shown in FIG. 1, an embodiment of the present application provides an organic light emitting diode (OLED) display panel 100 including a substrate 101; a thin film transistor (TFT) layer 102 disposed on a side of the substrate 101; a pixel definition layer 103 disposed on a side of the TFT layer 102 away from the substrate 101. The pixel definition layer 103 is separately arranged to form a plurality of pixel opening areas, and each pixel opening area is sequentially arranged with an anode 1044, a light emitting unit 1045, a cathode 1046, a first encapsulation layer 105, and a micro lens 106 stacked from inside to outside. The first encapsulation layer 105 is formed by stacking a first inorganic layer, an organic layer, and a second inorganic layer.

Specifically, the substrate 101 is a flexible substrate, usually a glass substrate, or a substrate of other materials, which is not limited herein. The TFT layer 102 is disposed on a surface of the substrate 101 and includes a buffer layer and a driving layer stacked from top to bottom. The buffer layer is formed on the surface of the substrate 101. The driving layer is formed on a surface of the buffer layer and includes a plurality of driving thin film transistors. The driving thin film transistor includes at least a gate, a gate insulating layer, an active layer, and a source/drain layer. The gate insulating layer is formed on the gate layer. The active layer is formed on the gate insulating layer, and the active layer is insulated from the gate layer. The source/drain layer is disposed on two sides of the active layer. The source/drain layer includes a source and a drain. The source and the drain are respectively electrically connected to corresponding positions of the active layer. The pixel definition layer 103 is disposed on a surface of the TFT layer 102. The pixel definition layer 103 includes a first pixel definition layer 1031, a second pixel definition layer 1032, a third pixel definition layer 1033, and a fourth pixel definition layer 1034. The first pixel definition layer 1031 and the second pixel definition layer 1032 are disposed separately to form a pixel opening area 1041. The second pixel definition layer 1032 and the third pixel definition layer 1033 are disposed separately to form a pixel opening area 1042. The third pixel definition layer 1033 and the fourth pixel definition layer 1034 are disposed separately to form a pixel opening area 1043. Each pixel opening area is sequentially stacked with an anode 1044, a light emitting unit 1045, a cathode 1046, a first encapsulation layer 105, and a micro lens 106 in a similar structure from inside to outside. The embodiments of the present application use the pixel opening area 1041 as an example to illustrate an invention point.

The pixel opening area 1041 has an inverted trapezoid shape and may also be a shape in an inverted triangle shape or a fan shape (the specific shapes are not drawn one by one in the drawings). In the pixel opening area 1041, an anode 1044, a light emitting unit 1045, a cathode 1046, a first encapsulation layer 105, and a micro lens 106 are stacked in this order from the inside to the outside. The anode 1044, the light emitting unit 1045, and the cathode 1046 are straight segments. The anode 1044 is disposed on a surface of the TFT layer 102 and is electrically connected to the drain of the TFT layer 102. The light emitting unit 1045 is attached to a surface of the anode 1044. The cathode 1046 is attached to a surface of the light emitting unit 1045, and two ends of the anode 1044, two ends of the light emitting unit 1045, and two ends of the cathode 1046 are attached to aside wall of the pixel opening area 1041. The first encapsulation layer 105 is printed on an entire surface, is curved, and covers the cathode 1046 and a dam area of the pixel definition layer 103.

The micro lens 106 includes a first micro lens 1061 and a second micro lens 1064. The first micro lens 1061 is positioned in the pixel opening area 1041, and the first micro lens 1061 protrudes and closes the pixel opening area 1041. The second micro lens 1064 is aligned with the first micro lens 1041 and covers the first micro lens 1061 and the pixel opening area 1041.

A bottom and two sides of the first micro lens 1061 are attached to a surface of the first encapsulation layer 105. A first planarization layer 1062 is provided between the first micro lens 1061 and the second micro lens 1064. A second encapsulation layer 1063 is provided on a side of the first planarization layer 1062 away from the light emitting unit 1045. The second encapsulation layer 1063 comprises an inorganic layer. A second planarization layer 1065 is provided on a surface of the second micro lens 1064. Material of the first planarization layer 1062 and material of the second planarization layer 1065 comprise at least one of acrylic-based resin, epoxy resin, phenolic resin, polyamide-based resin, polyimide-based resin, and unsaturated polyester resin. Material of the first micro lens 1061 preferably comprises polytetrafluoroethylene. Material of the second micro lens 1064 preferably comprises polystyrene. A refractive index of the first micro lens 1061 ranges from 1.1 to 1.35. A refractive index of the first planarization layer 1062 and a refractive index of the second planarization layer 1065 range from 1.4 to 1.5. A refractive index of the second micro lens 1064 ranges from 1.5 to 2.0.

Because the refractive index of the first micro lens 1061 is less than the refractive index of the first planarization layer 1062, a viewing angle of the light emitted by the first micro lens 1061 will be narrower, and more light will enter the second micro lens 1064. The refractive index of the second micro lens 1064 is greater than the refractive index of the second planarization layer 1065. An angle of light formed by the light emitted by the second micro lens 1064 and a vertical display surface becomes larger, so that a viewing angle of the light emitted from the OLED display panel is expanded. Therefore, the double-layer microstructure can improve light extraction rate of the OLED display panel and improve a display viewing angle. For example, light S1 in the OLED display panel of this embodiment enters the first planarization layer 1062 from the first micro lens 1061, and changes from θ1 to θ2, and θ1 is greater than θ2. When the light S1 is shifted toward a center of the micro lens, a viewing angle of the light will become narrower, and then enters the second planarization layer 1065 from the second micro lens 1064, changes from θ3 to θ4, θ3 is less than θ4, and θ4 is greater than θ1, such that a viewing angle of the light emitted from the OLED display panel is expanded.

As shown in FIG. 2, both the first micro lens 1061 and the second micro lens 1062 each have an arc-shaped structure and a side facing the substrate 101 being a plane. A horizontal angle 85 of the arc-shaped structure near a center line S2 at position A is less than a horizontal angle 86 away from the center line S2 at position B. A pixel unit on the OLED display panel 100 has a virtual pixel unit 201, a virtual pixel unit 202, and a virtual pixel unit 203 on the arc-shaped structure. Most of the light of the virtual pixel unit 201, the virtual pixel unit 202, and the virtual pixel unit 203 exits along a vertical direction of an outline of the arc-shaped structure. This optimizes and expands a viewing angle of the light emitted from the OLED display panel 100 and improves the display performance of the OLED display panel 100.

According to the above OLED display panel, an embodiment of the present application provides a method of manufacturing an OLED display panel. As shown in FIG. 3, the method includes:

Step S10, providing a substrate and sequentially forming a TFT layer and a pixel definition layer on the substrate, wherein the pixel definition layer is disposed separately to form a plurality of pixel opening areas.

Step S20, sequentially laminating the pixel opening area from inside to outside to form an anode, a light emitting unit, a cathode, a first encapsulation layer, and a micro lens, wherein the first encapsulation layer is formed by stacking an inorganic layer, an organic layer, and an inorganic layer.

Preferably, the step S20 of sequentially laminating the pixel opening area from inside to outside to form the anode, the light emitting unit, the cathode, the first encapsulation layer, and the micro lens further comprises:

Spraying ink droplets on a surface of the first encapsulation layer in the pixel opening area using an inkjet printing technology, curing the ink droplets to form a first micro lens, wherein the first micro lens protrudes and closes the pixel opening area.

After the first micro lens is completed, coating a first planarization layer on a surface of the first micro lens and depositing a second encapsulation layer on the first planarization layer, wherein a refractive index of the first micro lens is less than a refractive index of the first planarization layer, and the second encapsulation layer comprises an inorganic layer.

Spraying ink droplets on a surface of the second encapsulation layer using the inkjet printing technology, curing the ink droplets to form a second micro lens, wherein the second micro lens is aligned with the first micro lens and covers the first micro lens and the pixel opening area.

After the second micro lens is completed, coating a second planarization layer on a surface of the second micro lens, wherein a refractive index of the second micro lens is greater than a refractive index of the second planarization layer.

Specifically, as shown in FIG. 4, a TFT layer 102 and a pixel definition layer 103 are sequentially formed on a surface of the substrate 101. The pixel definition layer 103 includes a pixel definition layer 1031, a pixel definition layer 1032, a pixel definition layer 1033, and a pixel definition layer 1034. A pixel opening area 1041 is formed between the pixel definition layer 1031 and the pixel definition layer 1032. A pixel opening area 1042 is formed between the pixel definition layer 1032 and the pixel definition layer 1033. A pixel opening area 1043 is formed between the pixel definition layer 1033 and the pixel definition layer 1034.

Figure 5:
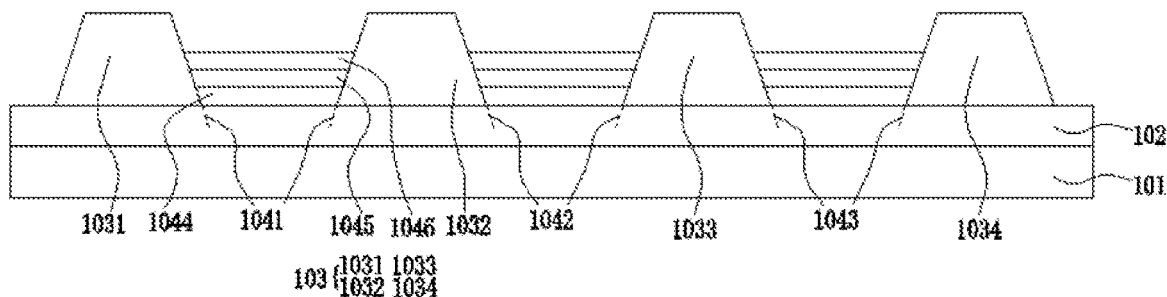
FIG. 5 is a schematic structural diagram of an anode, a light emitting unit, and a cathode in an OLED display panel provided by an embodiment of the present application.
Figure 6:
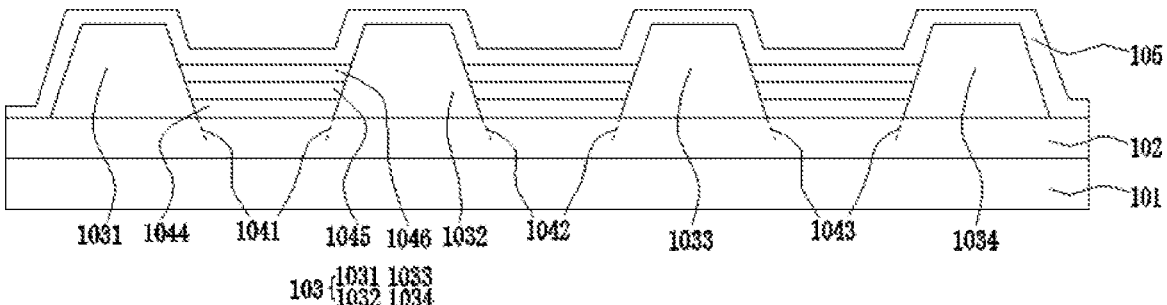
FIG. 6 is a schematic structural diagram of a first encapsulation layer in an OLED display panel provided by an embodiment of the present application.

As shown in FIG. 5 and FIG. 6, the pixel opening area is sequentially laminated from inside to outside to form an anode, a light emitting unit, a cathode, and a first encapsulation layer 105. Taking the pixel opening area 1041 as an example, the pixel opening area 1041 is sequentially provided with an anode 1044, a light emitting unit 1045, and a first encapsulation layer 105.

Figure 7:
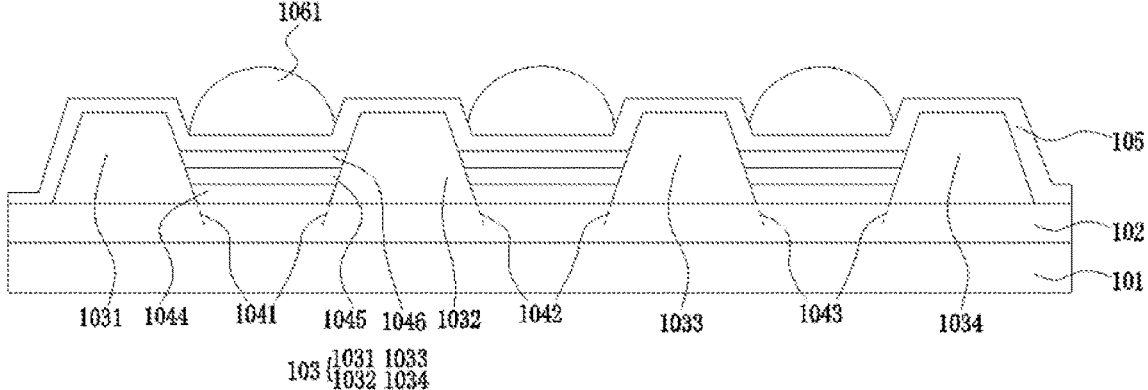
FIG. 7 is a schematic structural diagram of a first micro lens in an OLED display panel provided by an embodiment of the present application.

As shown in FIG. 7, using inkjet printing technology, ink droplets are sprayed on a surface of the first encapsulation layer 105 in the pixel opening area, and the ink droplets are cured to form a first micro lens, wherein the first micro lens protrudes and closes the pixel opening area. Taking the pixel opening area 1041 as an example, a first micro lens 1061 is formed on a surface of the first encapsulation layer 105.

Figure 8:
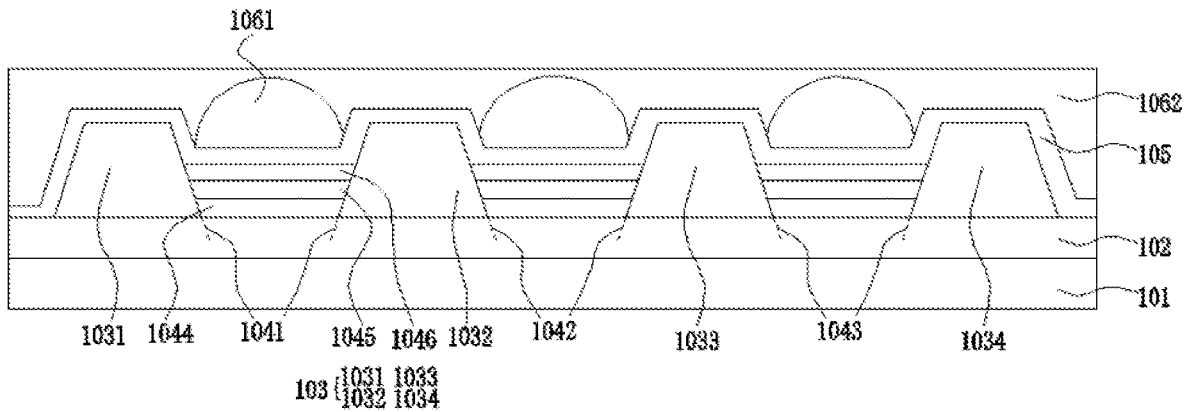
FIG. 8 is a schematic structural diagram of a first planarization layer in an OLED display panel provided by an embodiment of the present application.
Figure 9:
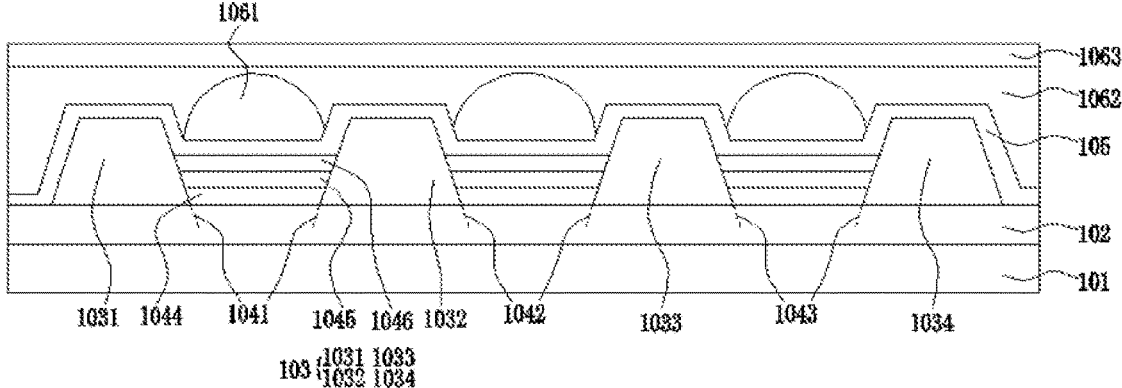
FIG. 9 is a schematic structural diagram of a structure of a second encapsulation layer in an OLED display panel provided by an embodiment of the present application.

As shown in FIG. 8 and FIG. 9, after the first micro lens is completed, a first planarization layer 1062 is coated on a surface of the first micro lens, and a second encapsulation layer 1063 is deposited on the first planarization layer 1062. A refractive index of the first micro lens is less than a refractive index of the first planarization layer 1062, and the second encapsulation layer 1063 comprises an inorganic layer.

Figure 10:
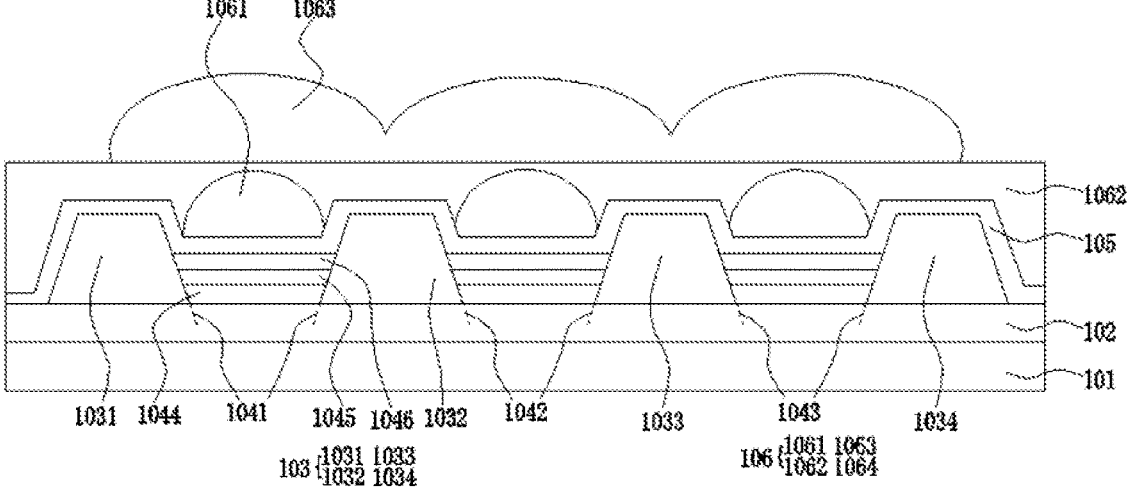
FIG. 10 is a schematic structural diagram of a second micro lens in an OLED display panel provided by an embodiment of the present application.

As shown in FIG. 10, inkjet printing technology is used to spray ink droplets on a surface of the second encapsulation layer 1063 to cure the ink droplets to form a second micro lens. The second micro lens is aligned with the first micro lens to cover the first micro lens and the pixel opening area. Taking the pixel opening area 1041 as an example, a second micro lens 1063 is formed on a surface of the second encapsulation layer 1063, and the second micro lens 1063 is aligned with the first micro lens 1061.

Figure 11:
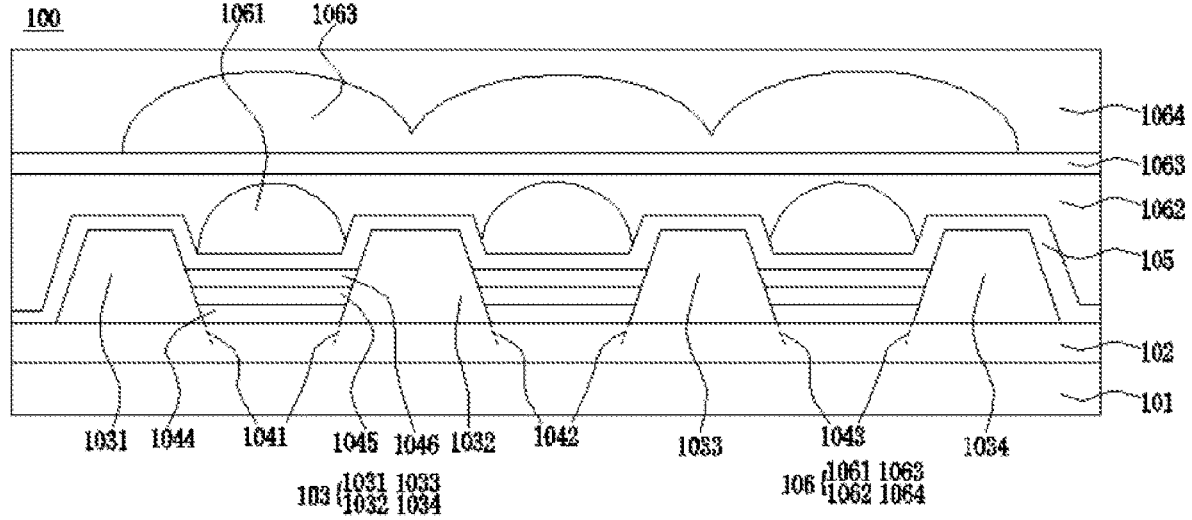
FIG. 11 is a schematic structural diagram of a structure of a second planarization layer in an OLED display panel provided by an embodiment of the present application.

As shown in FIG. 11, after the second micro lens is completed, a second planarization layer 1064 is coated on a surface of the second micro lens, wherein a refractive index of the second micro lens is greater than a refractive index of the second planarization layer.

According an object of the present application, an embodiment of the present application further provides a micro lens. As described in part of FIG. 1, the micro les comprises a first micro lens and a second micro lens. The first micro lens is aligned with the second micro lens, and the second micro lens covers the first micro lens. The micro lens further comprises a first planarization layer disposed between the first micro lens and the second micro lens and a second planarization disposed on a surface of the second micro lens. A refractive index of the first micro lens is less than a refractive index of the first planarization layer, and a refractive index of the second micro lens is greater than a refractive index of the second planarization layer. The micro lens further comprises a second encapsulation layer disposed on a side of the planarization layer away from the light emitting unit, wherein the second encapsulation layer comprises an inorganic layer. Material of the first planarization layer and material of the second planarization layer comprise at least one material of acrylic-based resin, epoxy resin, phenolic resin, polyamide-based resin, polyimide-based resin, and unsaturated polyester resin. Material of the first micro lens comprises polytetrafluoroethylene. Material of the second micro lens comprises polystyrene. The refractive index of the first micro lens ranges from 1.1 to 1.35, the refractive index of the first planarization layer and the refractive index of the second planarization layer range from 1.4 to 1.5, and the refractive index of the second micro lens ranges from 1.5 to 2.0. The first micro lens and the second micro lens are arc-shaped structures, and each have a side facing the substrate being a plane. A horizontal angle of the arc-shaped structure near a center line is less than a horizontal angle of the circular arc structure away from the center line.

Beneficial effect of embodiments of the present application: the embodiments of the present application provide an OLED display panel, a method of manufacturing the same, and a micro lens. Each pixel opening area is provided with a first micro lens and a second micro lens. The first micro lens is positioned in the pixel opening area, protrudes and closes the pixel opening area. The second micro lens is aligned with the first micro lens and covers the first micro lens and the pixel opening area. A first planarization layer is provided between the first micro lens and the second micro lens. A second planarization layer is provided on a surface of the second micro lens. A refractive index of the first micro lens is less than a refractive index of the first planarization layer. Therefore, the first micro lens narrows a viewing angle of the outgoing light, and more light hits the second micro lens. A refractive index of the second micro lens is greater than a refractive index of the second planarization layer, and an emission angle of the light emitted by the second micro lens becomes larger, thereby expanding an OLED display viewing angle. Therefore, the double-layer micro lens can improve a light extraction rate of the OLED display panel and improve a display viewing angle.

In summary, although the present application has been disclosed as above with preferred embodiments, the above preferred embodiments are not intended to limit the present application. Those of ordinary skill in the art can make various changes and modifications without departing from the spirit and scope of the present application. Therefore, the protection scope of the present application is subject to the scope defined by the claims.

What is claimed is:

1. An organic light emitting diode (OLED) display panel, comprising:
a substrate;
a thin film transistor (TFT) layer disposed on a side of the substrate; and
a pixel definition layer disposed on a side of the TFT layer away from the substrate;
wherein the pixel definition layer is separately arranged to form a plurality of pixel opening areas, and each of the pixel opening areas is sequentially arranged with an anode, a light emitting unit, a cathode, a first encapsulation layer, and a micro lens from inside to outside;
wherein the micro lens comprises a first micro lens and a second micro lens;
wherein the first micro lens is positioned in the pixel opening area, protrudes and closes the pixel opening area, the second micro lens is aligned with the first micro lens and covers the first micro lens and the pixel opening area;
wherein the OLED display panel further comprises:
a first planarization layer disposed between the first micro lens and the second micro lens;
a second planarization layer disposed on a surface of the second micro lens, wherein a refractive index of the first micro lens is less than a refractive index of the first planarization layer, a refractive index of the second micro lens is greater than a refractive index of the second planarization layer; and
a second encapsulation layer disposed on a side of the first planarization layer away from the light emitting unit, wherein the second encapsulation layer comprises an inorganic layer;
wherein when light enters the first planarization layer from the first micro lens, a viewing angle of the light changes from θ1 to θ2, and θ1 is greater than θ2; when the light is shifted toward a center of the first micro lens, the light enters the second planarization layer from the second micro lens, and a viewing angle of the light changes from θ3 to θ4, θ3 is less than θ4, and θ4 is greater than θ1;

wherein both the first micro lens and the second micro lens each have an arc-shaped structure and a side facing the substrate being a plane, a horizontal angle θ5 of the arc-shaped structure near a center line at first position is less than a horizontal angle θ6 away from the center line at a second position, a pixel unit on the OLED display panel has virtual pixel units on the arc-shaped structure, and most of the light of the virtual pixel units exits along a vertical direction of an outline of the arc-shaped structure;
wherein the first encapsulation layer comprises an accommodation recess defined in a surface of the first encapsulation layer away from the substrate and tapered along a direction from the first encapsulation layer to the substrate, the first micro lens is accommodated in the accommodation recess, and a bottom and two sides of the first micro lens is attached an inner surface of the accommodation recess of the first encapsulation layer.

2. The OLED display panel according to claim 1, wherein material of the first planarization layer and material of the second planarization layer comprise at least one material of acrylic-based resin, epoxy resin, phenolic resin, polyamide-based resin, polyimide-based resin, and unsaturated polyester resin; material of the first micro lens comprises polytetrafluoroethylene; material of the second micro lens comprises polystyrene.

3. The OLED display panel according to claim 1, wherein the refractive index of the first micro lens ranges from 1.1 to 1.35, the refractive index of the first planarization layer and the refractive index of the second planarization layer range from 1.4 to 1.5, and the refractive index of the second micro lens ranges from 1.5 to 2.0.

4. The OLED display panel according to claim 1, wherein the first micro lens and the second micro lens are arc-shaped structures, and each have a side facing the substrate being a plane.

5. The OLED display panel according to claim 4, wherein a horizontal angle of the arc-shaped structure near a center line is less than a horizontal angle of the circular arc structure away from the center line.

6. The OLED display panel according to claim 1, wherein the pixel opening area is one of an inverted trapezoid, an inverted triangle, and a fan shape.

7. The OLED display panel according to claim 1, wherein the anode, the light emitting unit, and the cathode are straight segments, the anode is positioned on a surface of the TFT layer, the light emitting unit is attached to a surface of the anode, the cathode is attached to a surface of the light emitting unit, and two ends of the anode, two ends of the light emitting unit, and two ends of the cathode are attached to a side wall of the pixel opening area.

8. The OLED display panel according to claim 1, wherein the first encapsulation layer is formed by stacking an inorganic layer, an organic layer, and an inorganic layer.

9. A method of manufacturing an OLED display panel, comprising:
a step S10, providing a substrate and sequentially forming a TFT layer and a pixel definition layer on the substrate, wherein the pixel definition layer is disposed separately to form a plurality of pixel opening areas;
a step S20, sequentially laminating the pixel opening area from inside to outside to form an anode, a light emitting unit, a cathode, a first encapsulation layer, and a micro lens, wherein the first encapsulation layer is formed by stacking an inorganic layer, an organic layer, and an inorganic layer;

wherein the step S20 of sequentially laminating the pixel opening area from inside to outside to form the anode, the light emitting unit, the cathode, the first encapsulation layer, and the micro lens further comprises:

spraying ink droplets on a surface of the first encapsulation layer in the pixel opening area using an inkjet printing technology, curing the ink droplets to form a first micro lens, wherein the first micro lens protrudes and closes the pixel opening area;

after the first micro lens is completed, coating a first planarization layer on a surface of the first micro lens and depositing a second encapsulation layer on the first planarization layer, wherein a refractive index of the first micro lens is less than a refractive index of the first planarization layer, and the second encapsulation layer comprises an inorganic layer;

spraying ink droplets on a surface of the second encapsulation layer using the inkjet printing technology, curing the ink droplets to form a second micro lens, wherein the second micro lens is aligned with the first micro lens and covers the first micro lens and the pixel opening area;

after the second micro lens is completed, coating a second planarization layer on a surface of the second micro lens, wherein a refractive index of the second micro lens is greater than a refractive index of the second planarization layer;

wherein when light enters the first planarization layer from the first micro lens, a viewing angle of the light changes from $\theta1$ to $\theta2$, and $\theta1$ is greater than $\theta2$; when the light is shifted toward a center of the first micro lens, the light enters the second planarization layer from the second micro lens, and a viewing angle of the light changes from $\theta3$ to $\theta4$, $\theta3$ is less than $\theta4$, and $\theta4$ is greater than $\theta1$;

wherein both the first micro lens and the second micro lens each have an arc-shaped structure and a side facing the substrate being a plane, a horizontal angle $\theta5$ of the arc-shaped structure near a center line at first position is less than a horizontal angle $\theta6$ away from the center line at a second position, a pixel unit on the OLED display panel has virtual pixel units on the arc-shaped structure, and most of the light of the virtual pixel units exits along a vertical direction of an outline of the arc-shaped structure;

wherein the first encapsulation layer comprises an accommodation recess defined in a surface of the first encapsulation layer away from the substrate and tapered along a direction from the first encapsulation layer to the substrate, the first micro lens is accommodated in the accommodation recess, and a bottom and two sides of the first micro lens is attached an inner surface of the accommodation recess of the first encapsulation layer.

* * * * *